(12) United States Patent
Yasui et al.

(10) Patent No.: US 11,837,440 B2
(45) Date of Patent: Dec. 5, 2023

(54) SUBSTRATE PROCESSING APPARATUS, METHOD OF MANUFACTURING SEMICONDUCTOR DEVICE, AND RECORDING MEDIUM

(71) Applicant: KOKUSAI ELECTRIC CORPORATION, Tokyo (JP)

(72) Inventors: Takeshi Yasui, Toyama (JP); Katsunori Funaki, Toyama (JP); Masaki Murobayashi, Toyama (JP); Koichiro Harada, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 514 days.

(21) Appl. No.: 16/821,511

(22) Filed: Mar. 17, 2020

(65) Prior Publication Data

US 2020/0219699 A1    Jul. 9, 2020

Related U.S. Application Data

(63) Continuation of application No. PCT/JP2018/035217, filed on Sep. 21, 2018.

(30) Foreign Application Priority Data

Oct. 23, 2017 (JP) .................. 2017-204398

(51) Int. Cl.
    *H01J 37/32*      (2006.01)
    *H01L 21/02*      (2006.01)
    *H01L 21/308*      (2006.01)

(52) U.S. Cl.
    CPC ....... *H01J 37/3211* (2013.01); *H01J 37/3244* (2013.01); *H01L 21/02247* (2013.01);
(Continued)

(58) Field of Classification Search
    CPC ......... H01L 21/02164; H01L 21/02252; H01L 21/02238; H01L 21/02247; H01L 21/308;
(Continued)

(56) References Cited

U.S. PATENT DOCUMENTS

| | | | |
|---|---|---|---|
| 5,903,106 A | 5/1999 | Young et al. | |
| 6,253,704 B1 * | 7/2001 | Savas ................... | H01J 37/321 156/345.48 |

(Continued)

FOREIGN PATENT DOCUMENTS

| | | |
|---|---|---|
| JP | 11-162697 A | 6/1999 |
| JP | 2003-37101 A | 2/2003 |

(Continued)

OTHER PUBLICATIONS

International Search Report and Translation, PCT/JP2018/035217, dated Dec. 18, 2018, 5 pgs.

(Continued)

*Primary Examiner* — Brook Kebede
(74) *Attorney, Agent, or Firm* — Volpe Koenig

(57) ABSTRACT

There is provided a plasma vessel in which a process gas is plasma-excited; a substrate process chamber which is in communication with the plasma vessel; a gas supply system supplying the process gas; and a coil installed to wind around an outer periphery of the plasma vessel and supplied with high-frequency power, wherein the coil is installed such that: a distance from an inner periphery of the coil to an inner periphery of the plasma vessel at a predetermined position on the coil is different from a distance from the inner periphery of the coil to the inner periphery of the plasma vessel at another position on the coil; and a distance from the inner periphery of the coil to the inner periphery of (Continued)

the plasma vessel at a position at which an amplitude of a standing wave of a voltage applied to the coil is maximized is maximized.

12 Claims, 11 Drawing Sheets

(52) U.S. Cl.
CPC .. *H01L 21/308* (2013.01); *H01J 2237/24564* (2013.01); *H01J 2237/334* (2013.01)

(58) Field of Classification Search
CPC ......... H01L 21/31654; H01L 21/32105; H01L 21/67017; H01L 21/68742; H01L 21/68785; H01J 37/321; H01J 37/3211; H01J 37/3244
See application file for complete search history.

(56) References Cited

U.S. PATENT DOCUMENTS

| | | | |
|---|---|---|---|
| 2008/0179183 A1 | 7/2008 | Boitnott et al. | |
| 2009/0176381 A1* | 7/2009 | Hiyama | G03F 7/427 |
| | | | 257/E21.328 |
| 2009/0229522 A1 | 9/2009 | Nishimura | |
| 2010/0269980 A1 | 10/2010 | Nishimura et al. | |
| 2014/0106573 A1* | 4/2014 | Terasaki | H01J 37/3211 |
| | | | 438/771 |
| 2017/0092647 A1 | 3/2017 | Nakayama et al. | |

FOREIGN PATENT DOCUMENTS

| | | | |
|---|---|---|---|
| JP | 2009-224596 A | | 10/2009 |
| JP | 2010-258324 A | | 11/2010 |
| JP | 2014-75579 A | | 4/2014 |
| JP | 2016-18727 A | | 2/2016 |
| JP | 2016018727 A | * | 2/2016 |
| JP | 2017-69254 A | | 4/2017 |
| KR | 10-2001-0032200 A | | 4/2001 |
| KR | 10-2008-0055293 A | | 6/2008 |

OTHER PUBLICATIONS

Japanese Office Action and Machine Translation of Japanese Patent Application No. 2019-526629, dated Jun. 7, 2019, 7 pgs.
Korean Office Action and Machine Translation of Koran Patent Application No. 10-2019-7020190, dated Sep. 18, 2019, 8pgs.
Chinese Office Action dated Mar. 31, 2022 for Chinese Patent Application No. 201880059829.5.

* cited by examiner

SUBSTRATE PROCESSING APPARATUS, METHOD OF MANUFACTURING SEMICONDUCTOR DEVICE, AND RECORDING MEDIUM

CROSS-REFERENCE TO RELATED APPLICATION

The application is a Bypass Continuation Application of PCT International Application No. PCT/JP2018/035217, filed on Sep. 21, 2018 and designating the United States, the international application being based upon and claiming the benefit of priority from Japanese Patent Application No. 2017-204398, filed on Oct. 23, 2017, the entire content of which is incorporated herein by reference.

TECHNICAL FIELD

The present disclosure relates to a substrate processing apparatus, a method of manufacturing a semiconductor device, and a recording medium.

BACKGROUND

As an example of a process of manufacturing a semiconductor device, when forming a pattern of a semiconductor device such as a flash memory or a logic circuit, a process of performing a predetermined processing on a substrate such as nitriding is often carried out.

For example, a surface of a pattern formed on a substrate is modified using a plasma-excited process gas.

When the substrate is processed by plasma-exciting the process gas, electrons or reactive species such as radicals or ions are generated in a process chamber. In this case, the generated ions may be accelerated due to an effect of electric field formed by an electrode to which high-frequency power is applied, and may collide with an inner wall of the process chamber to cause sputtering. When the inner wall of the process chamber is sputtered, a component of a substance constituting a surface of the inner wall may be released into the process chamber and introduced into a film to be processed on the substrate, thereby adversely affecting the substrate processing.

The present disclosure provides a technique capable of reducing occurrence of sputtering on an inner wall of a process chamber or the like, which is generated by plasma-exciting a process gas in the process chamber.

SUMMARY

According to one or more embodiments of the present disclosure, there is provided a plasma vessel in which a process gas is plasma-excited; a substrate process chamber which is in fluid communication with the plasma vessel; a gas supply system configured to supply the process gas into the plasma vessel; and a coil installed to wind around an outer periphery of the plasma vessel and configured to be supplied with high-frequency power, wherein the coil is installed such that: a distance from an inner periphery of the coil to an inner periphery of the plasma vessel at a predetermined position on the coil between one end and the other end of the coil is different from a distance from the inner periphery of the coil to the inner periphery of the plasma vessel at another position on the coil; and a distance from the inner periphery of the coil to the inner periphery of the plasma vessel at a position on the coil at which an amplitude of a standing wave of a voltage applied to the coil is maximized is maximized.

DETAILED DESCRIPTION

Figure 1:
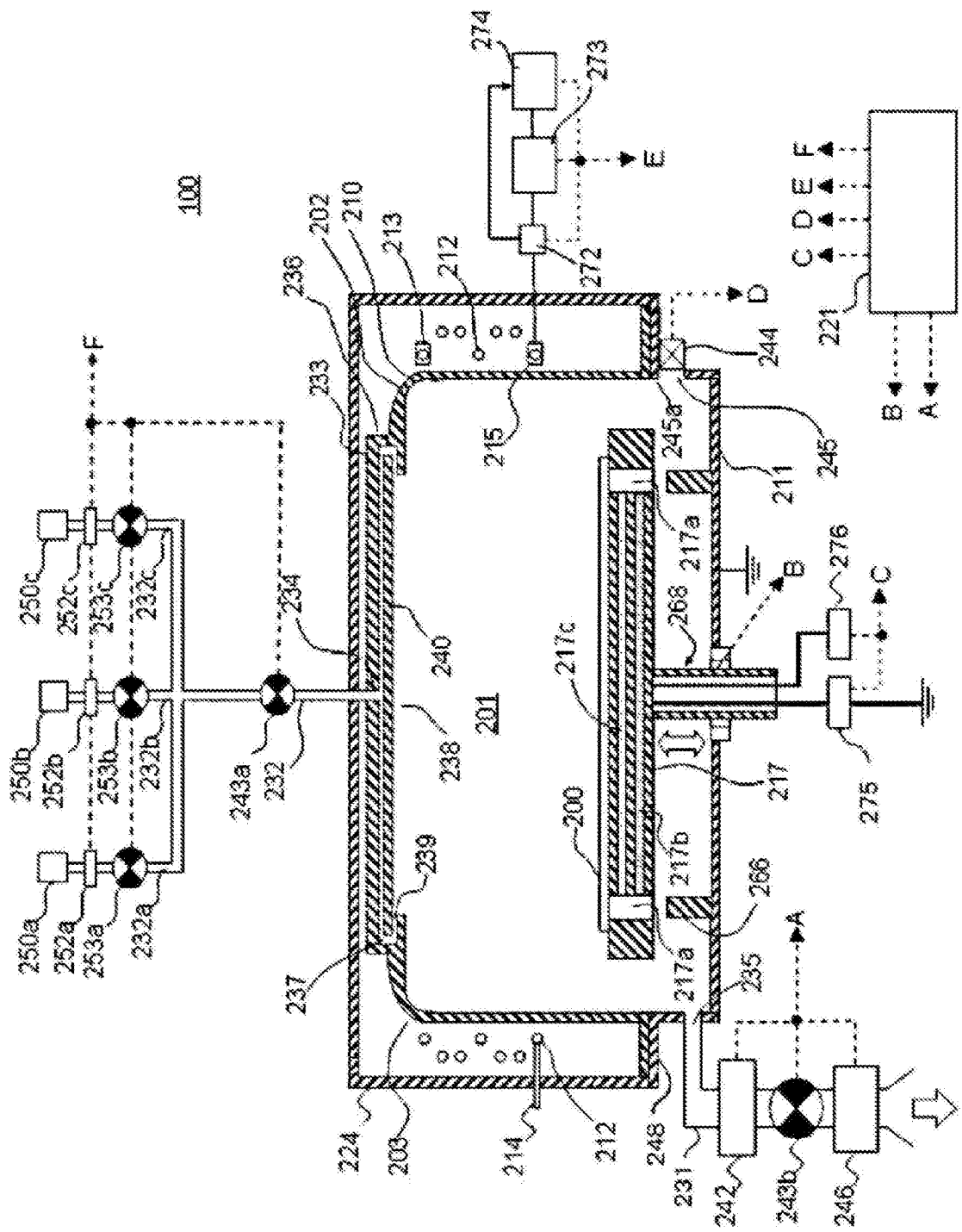
FIG. 1 is a schematic cross sectional view of a substrate processing apparatus according to an embodiment of the present disclosure.

One or More Embodiments of the Present Disclosure (1) Configuration of Substrate Processing Apparatus A substrate processing apparatus according to an embodiment of the present disclosure will now be described with reference to FIG. 1. The substrate processing apparatus according to the present embodiment is configured to perform oxidation on a film formed on a substrate surface.

(Process Chamber)

A processing apparatus 100 includes a process furnace 202 configured to plasma-process a wafer 200. A process vessel 203 constituting a process chamber 201 is installed at the process furnace 202. The process vessel 203 includes a dome-shaped upper vessel 210 as a first vessel, and a bowl-shaped lower vessel 211 as a second vessel. The process chamber 201 is formed by covering the upper vessel 210 over the lower vessel 211. The upper vessel 210 includes, for example, a non-metallic material such as aluminum oxide ($Al_2O_3$) or quartz ($SiO_2$), and the lower vessel 211 includes, for example, aluminum (Al). In the present embodiment, the upper vessel 210 includes quartz. Furthermore, the upper vessel 210 constitutes a plasma vessel which forms a plasma generation space as described hereinbelow.

In addition, a gate valve 244 is installed at a lower sidewall of the lower vessel 211. The gate valve 244 is configured to load or unload the wafer 200 into or from the process chamber 201 via a loading/unloading port 245 using a transfer mechanism when it is opened. The gate valve 244 may be a sluice valve which maintains air-tightness in the process chamber 201 when it is closed.

The process chamber 201 includes the plasma generation space around which a resonance coil 212 is installed, and a substrate processing space which is in fluid communication with the plasma generation space and serves as a substrate process chamber in which the wafer 200 is processed. The plasma generation space is a space in which plasma is generated, and is a space above a lower end of the resonance coil 212 and below an upper end of the resonance coil 212 in the process chamber. Further, the substrate processing space is a space in which the substrate is processed using plasma, and is a space below the lower end of the resonance coil 212. In the present embodiment, the plasma generation space and the substrate processing space are configured to have substantially the same horizontal diameter.

(Susceptor)

A susceptor 217 serving as a substrate mounting table for mounting the wafer 200 is disposed at a center on a bottom side of the process chamber 201. The susceptor 217 includes, for example, a non-metallic material such as, aluminum nitride, ceramics, quartz, or the like, and is configured to reduce metal contamination on a film or the like formed on the wafer 200.

A heater 217b as a heating mechanism is integrally embedded in the susceptor 217. The heater 217b is configured to heat a surface of the wafer 200, for example, from about 25 to 750 degrees C., when electric power is supplied.

The susceptor 217 is electrically insulated from the lower vessel 211. An impedance adjustment electrode 217c is installed in the susceptor 217 to further improve the uniformity of density of plasma generated over the wafer 200 mounted on the susceptor 217, and is grounded through an impedance variable mechanism 275 serving as an impedance adjuster. The impedance variable mechanism 275 includes a coil and a variable capacitor, and is configured to change an impedance within a range of about 0Ω to a parasitic impedance value of the process chamber 201 by controlling inductance and resistance of the coil and the capacitance value of the variable capacitor. Thus, it is possible to control the potential (bias voltage) of the wafer 200 by using the impedance adjustment electrode 217c and the susceptor 217. Furthermore, in the present embodiment, since the uniformity of the density of the plasma generated over the wafer 200 can be improved as described hereinbelow, when the uniformity of the density of the plasma falls within a desired range, a bias voltage control using the impedance adjustment electrode 217c may not be performed. In addition, when the bias voltage control is not performed, the electrode 217c may not be installed at the susceptor 217. However, the bias voltage control may be performed to further improve the uniformity.

A susceptor elevator mechanism 268 including a driving mechanism for raising or lowering the susceptor is installed at the susceptor 217. In addition, through holes 217a are formed at the susceptor 217, and wafer push-up pins 266 are installed at a bottom surface of the lower vessel 211. The through holes 217a and the wafer push-up pins 266 are respectively installed at least at three positions facing each other. When the susceptor 217 is lowered by the susceptor elevator mechanism 268, the wafer push-up pins 266 are configured to pass through the through holes 217a in a non-contact state with the susceptor 217. The substrate mounting table according to the present embodiment includes the susceptor 217, the heater 217b, and the electrode 217c.

(Gas Supplier)

A gas supply head 236 is installed above the process chamber 201, namely above the upper vessel 210. The gas supply head 236 includes a cap-shaped lid 233, a gas introduction hole 234, a buffer chamber 237, an opening 238, a shield plate 240, and a gas injection hole 239, and is configured to supply a reaction gas into the process chamber 201. The buffer chamber 237 may act as a diffusion space for diffusing the reaction gas introduced from the gas introduction hole 234.

A downstream end of a nitrogen-containing gas supply pipe 232a for supplying nitrogen ($N_2$) gas as a nitrogen-containing gas, a downstream end of a hydrogen-containing gas supply pipe 232b for supplying hydrogen ($H_2$) gas as a hydrogen-containing gas, and an inert gas supply pipe 232c for supplying argon (Ar) gas as an inert gas are connected to the gas introduction hole 234 so that they can be joined. A $N_2$ gas supply source 250a, a mass flow controller (MFC) 252a, which is a flow rate control device, and a valve 253a, which is an opening/closing valve, are installed at the nitrogen-containing gas supply pipe 232a sequentially from an upstream side. A $H_2$ gas supply source 250b, an MFC 252b, and a valve 253b are installed at the hydrogen-containing gas supply pipe 232b sequentially from an upstream side. An Ar gas supply source 250c, an MFC 252c, and a valve 253c are installed at the inert gas supply pipe 232c sequentially from an upstream side. A valve 243a is installed at a downstream side at which the nitrogen-containing gas supply pipe 232a, the hydrogen-containing gas supply pipe 232b, and the inert gas supply pipe 232c are joined, and is connected to an upstream end of the gas introduction hole 234. The process gas such as the nitrogen-containing gas, the hydrogen-containing gas, the inert gas, and the like can be supplied into the process chamber 201 via the gas supply pipes 232a, 232b, and 232c while adjusting the flow rates of the respective gases by the MFCs 252a, 252b, and 252c by opening or closing the valves 253a, 253b, 253c, and 243a.

A gas supplier (gas supply system) according to the present embodiment includes the gas supply head 236, the nitrogen-containing gas supply pipe 232a, the hydrogen-containing gas supply pipe 232b, the inert gas supply pipe 232c, the MFCs 252a, 252b, and 252c, and the valves 253a, 253b, 253c, and 243a.

In addition, a nitrogen-containing gas supply system according to the present embodiment includes the gas supply head 236, the nitrogen-containing gas supply pipe 232a, the MFC 252a, and the valves 253a and 243a. Furthermore, a hydrogen gas supply system according to the present embodiment includes the gas supply head 236, the hydrogen-containing gas supply pipe 232b, the MFC 252b, and the valves 253b and 243a. Moreover, an inert gas supply system according to the present embodiment includes the gas supply head 236, the inert gas supply pipe 232c, the MFC 252c, and the valves 253c and 243a.

Furthermore, the substrate processing apparatus according to the present embodiment is configured to perform nitriding by supplying $N_2$ gas as a nitrogen-containing gas from the nitrogen-containing gas supply system, but a gas supply system for supplying another gas into the process chamber 201 may be installed instead of the nitrogen-containing gas supply system. According to the substrate processing apparatus configured in this way, another plasma treatment process may be performed instead of the nitriding of the substrate. In this case, another gas supply source is installed instead of the $N_2$ gas supply source 250a.

(Exhauster)

A gas exhaust port 235 configured to exhaust the reaction gas from an interior of the process chamber 201 is installed at a sidewall of the lower vessel 211. An upstream end of the gas exhaust pipe 231 is connected to the gas exhaust port 235. An auto pressure controller (APC) valve 242 as a pressure regulator (pressure regulating part), a valve 243b as an opening/closing valve, and a vacuum pump 246 as a vacuum exhaust device are installed at the gas exhaust pipe 231 sequentially from an upstream side. An exhauster according to the present embodiments includes the gas exhaust port 235, the gas exhaust pipe 231, the APC valve 242, and the valve 243b. The vacuum pump 246 may also be included in the exhauster.

(Plasma Generator)

A spiral resonance coil 212 as a first electrode is installed at an outer peripheral portion of the process chamber 201, namely at an outer side of the sidewall of the upper vessel 210, so as to surround the process chamber 201. An RF sensor 272, a high-frequency power source 273, and a matcher 274 for matching impedance or output frequency of the high-frequency power source 273 are connected to the resonance coil 212.

The high-frequency power source 273 is configured to supply high-frequency power (RF power) to the resonance coil 212. The RF sensor 272 is installed at an output side of the high-frequency power source 273, and is configured to monitor information on a traveling wave or a reflected wave of the supplied high-frequency power. The reflected wave power monitored by the RF sensor 272 is input to the matcher 274, and the matcher 274 controls the impedance of the high-frequency power source 273 or the frequency of the output high-frequency power so that the reflected wave is minimized, based on the information on the reflected wave input from the RF sensor 272.

The high-frequency power source 273 includes a power source controller (control circuit) including a pre-amplifier and a high-frequency oscillation circuit for defining an oscillation frequency and its output, and an amplifier (output circuit) for amplifying the oscillation frequency and the output to a predetermined output. The power source controller controls the amplifier based on output conditions of electric power and a frequency preset through an operation panel. The amplifier supplies constant high-frequency power to the resonance coil 212 via a transmission line.

A winding diameter, a winding pitch, and the number of turns of the resonance coil 212 are set to resonate at a certain wavelength, and a standing wave is formed on the resonance coil 212 to which the high-frequency power is supplied. An electrical length of the resonance coil 212 is set to a length equivalent to an integral multiple (e.g., 1 time, 2 times, . . . ) of one wavelength at a predetermined frequency of the high-frequency power supplied from the high-frequency power source 273.

Specifically, the resonance coil 212 may have an effective sectional area of 50 to 300 mm² and a coil diameter of 200 to 500 mm, and may wind about 2 to 60 times around the outer peripheral side of a room forming a plasma generation space 201a, so as to generate, for example, a magnetic field of about 0.01 to 10 gauss with high-frequency power of 800 kHz to 50 MHz and 0.1 to 5 kW, in consideration of applied electric power, an intensity of a generated magnetic field, an external shape of a device to be applied, or the like.

As a specific example, in the present embodiment, the frequency of the high-frequency power is set at 27.12 MHz, and the electrical length of the resonance coil 212 is set to a length of one wavelength (about 11 meters). The winding pitch of the resonance coil 212 is set at, for example, equal intervals of 24.5 mm. Furthermore, the winding diameter (diameter) of the resonance coil 212 is set to be larger than a diameter of the wafer 200. In the present embodiment, the diameter of the wafer 200 is set to φ300 mm, and the winding diameter of the resonance coil 212 is set to be φ500 mm or larger, which is larger than the diameter of the wafer 200. However, as will be described later, the winding diameter of the resonance coil 212 in the present embodiment is not constant, and is set so that at least a portion of the winding diameter thereof is different depending on a position between one end and the other end of the resonance coil 212.

As a material constituting the resonance coil 212, a copper pipe, a copper thin plate, an aluminum pipe, an aluminum thin plate, a material in which copper or aluminum is deposited on a polymer belt, or the like may be used. The resonance coil 212 has a flat plate shape made of an insulating material, and is supported by a plurality of supports (not shown) vertically erected on an upper end surface of a base plate 248.

Both ends of the resonance coil 212 are electrically grounded, at least one of which is grounded through a movable tap 213 to finely adjust the electrical length of the resonance coil when the device is initially installed or when a processing condition is changed. Reference numeral 214 in FIG. 1 denotes a fixed ground of the other end. A position of the movable tap 213 is adjusted so that resonance characteristics of the resonance coil 212 are substantially equal to resonance characteristics of the high-frequency power source 273. Furthermore, in order to finely adjust impedance of the resonance coil 212 when the device is initially installed or when a processing condition is changed, a power feeder is formed between the grounded both ends of the resonance coil 212 by a movable tap 215. Since the resonance coil 212 includes a variable ground and a variable power feeder, it is possible to even more easily adjust the resonance frequency and load impedance of the process chamber 201 as described hereinbelow.

In addition, a waveform adjustment circuit (not shown) including a coil and a shield is inserted into one end (or the other end, or the both ends) of the resonance coil 212 so that the phase and antiphase currents flow symmetrically with respect to an electrical midpoint of the resonance coil 212. The waveform adjustment circuit is configured to be an open circuit by setting the end of the resonance coil 212 to be in an electrically disconnected state or an electrically equivalent state. The end of the resonance coil 212 may not be grounded by a choke series resistor and may be DC-connected to a fixed reference potential.

A shielding plate 224 is installed to shield electric field outside the resonance coil 212 and to form a capacitance component (C component) necessary for configuring a resonance circuit between the shielding plate 224 and the resonance coil 212. The shielding plate 224 generally has a cylindrical shape using a conductive material such as an aluminum alloy or the like. The shielding plate 224 is disposed at a distance of about 5 to 150 mm from the outer periphery of the resonance coil 212. Although the shielding plate 224 is normally grounded so that its potential is equal to potential of the both ends of the resonance coil 212, one end or both ends of the shielding plate 224 are configured to adjust a tap position in order to accurately set the number of resonance of the resonance coil 212. Alternatively, trimming capacitance may be inserted between the resonance coil 212 and the shielding plate 224 in order to accurately set the number of resonance.

A plasma generator according to the present embodiment includes the resonance coil 212, the RF sensor 272, and the matcher 274. The high-frequency power source 273 may also be included as the plasma generator.

The plasma generation principle of the apparatus according to the present embodiment and the properties of generated plasma will now be described in detail. A plasma generation circuit constituted by the resonance coil 212 includes an RLC parallel resonance circuit. When the wavelength of the high-frequency power supplied from the high-frequency power source 273 and the electrical length of the resonance coil 212 are equal, a resonance condition of the resonance coil 212 becomes pure resistance by cancelling out the reactance component created by a capacitance component and an inductance component of the resonance coil 212. However, in the plasma generation circuit described above, when plasma is generated, an actual resonance frequency slightly varies due to a variation in capacitive coupling between a voltage portion of the resonance coil 212 and the plasma, a variation in inductive coupling between the plasma generation space 201a and the plasma, an excitation state of the plasma, or the like.

In the present embodiment, in order to compensate for deviation of resonance in the resonance coil 212 when the plasma is generated at the power source side, the RF sensor 272 detects the reflected wave power from the resonance coil 212 when the plasma is generated, and the matcher 274 is configured to correct the output of the high-frequency power source 273 based on the reflected wave power.

Specifically, the matcher 274 increases or decreases the output frequency or the impedance of the high-frequency power source 273 such that the reflected wave power is minimized, based on the reflected wave power from the resonance coil 212 when the plasma detected by the RF sensor 272 is generated. If the matcher 274 controls the impedance, the matcher 274 includes a variable capacitor control circuit which corrects preset impedance. If the matcher 274 controls the frequency, the matcher 274 includes a frequency control circuit which corrects a preset oscillation frequency of the high-frequency power source 273. Furthermore, the high-frequency power source 273 and the matcher 274 may be integrally configured.

With these configurations, since the high-frequency power at the actual resonance frequency of the resonance coil including the plasma is supplied (or since the high-frequency power is supplied to match the actual impedance of the resonance coil including the plasma) in the resonance coil 212 of the present embodiment, a standing wave is formed in which the phase voltage and the antiphase voltage may be always cancelled out. When the electrical length of the resonance coil 212 is equal to the wavelength of the high-frequency power, a highest phase current is generated at an electrical midpoint of the coil (a node at which the voltage is zero). Therefore, there is almost no capacitive coupling with the process chamber wall or the susceptor 217 near the electric midpoint, and donut-shaped induction plasma having an extremely low electric potential is formed near the electric midpoint.

(Winding Diameter of Resonance Coil)

The winding diameter of the resonance coil 212 of the present embodiment will now be described with reference to FIGS. 2 and 3.

Winding Diameter of Resonance Coil According to Comparative Example

Figure 2:
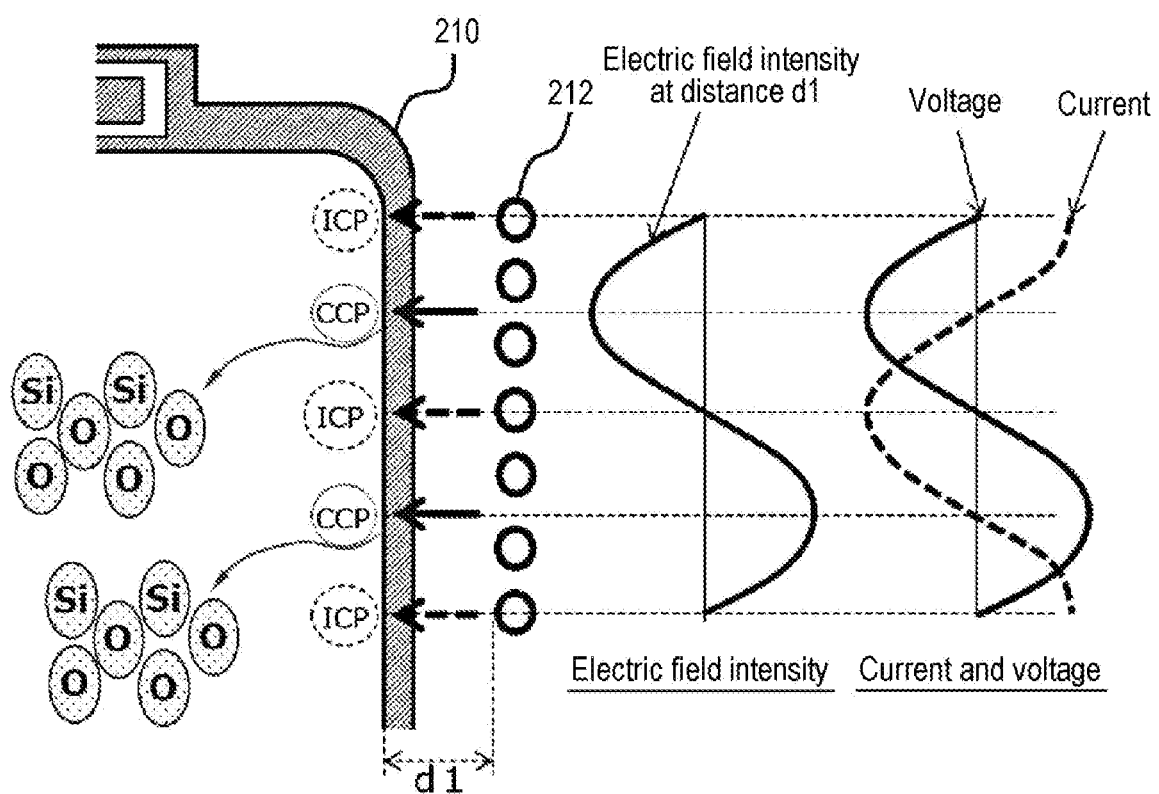
FIG. 2 is an explanatory view illustrating relationships between a winding diameter of a resonance coil and a current, a voltage, and an electric field intensity according to a comparative example of the present disclosure.

FIG. 2 illustrates an example (comparative example) when the winding diameter of the resonance coil 212 is constant at any position on the resonance coil 212. That is, when a distance (hereinafter, referred to as a coil separation distance) from an inner wall surface (an inner peripheral surface) of the upper vessel 210 to an inner diameter side surface (a surface on a side of the resonance coil facing the sidewall of the upper vessel 210, i.e., an inner peripheral surface) of the resonance coil 212 is set to d1, d1 is always constant in this comparative example. The distance d1 has a predetermined value in a range of 10 to 30 mm in some embodiments, and may be set to, for example, about 15 mm.

The configurations of this comparative example are similar to the configurations of the aforementioned present embodiment except for the winding diameter of the resonance coil 212, and standing waves of a current and a voltage having a length of one wavelength of the supplied high-frequency power are formed on a line of the resonance coil 212. In waveforms on a right side of FIG. 2, a broken line indicates a current and a solid line indicates a voltage. As illustrated by the waveform on the right side of FIG. 2, an amplitude of the standing wave of the current is maximized at the both ends (the lower end and the upper end) and the midpoint of the resonance coil 212.

A high-frequency magnetic field is formed near positions at which the amplitude of the current is maximized, and a high-frequency electric field induced by the high-frequency magnetic field causes a discharge of the process gas supplied into the plasma generation space in the upper vessel 210. When the process gas is excited by the discharge, plasma of the process gas is generated. Hereinafter, the plasma of the process gas generated by the high-frequency magnetic field formed near the positions (regions) at which the amplitude of the current is large as described above will be referred to as plasma of an inductively coupled plasma (ICP) component. As illustrated in FIG. 2, the plasma of the ICP component is intensively generated in a donut shape in regions near the both ends and the midpoint of the resonance coil 212 (regions indicated by circular broken lines) in a space along the inner wall surface in the upper vessel 210.

On the other hand, as illustrated in FIG. 2, an amplitude of the standing wave of the voltage is minimized (ideally zero) at the both ends (the lower end and the upper end) and the midpoint of the resonance coil 212, while the amplitude at some positions between them is maximized. In this case, the waveform on a left side of FIG. 2 indicates an intensity of a high-frequency electric field formed according to the amplitude of the voltage of the resonance coil 212 at a position of the distance d1 from the resonance coil 212 (i.e., a position of the inner wall surface of the upper vessel 210). A high-frequency electric field having a particularly large electric field intensity is formed near positions at which the amplitude of the voltage is maximized, and this high-frequency electric field causes a discharge of the process gas supplied into the plasma generation space in the upper vessel 210. When the process gas is excited by the discharge, plasma of the process gas is generated. Hereinafter, the plasma of the process gas generated by the high-frequency electric field formed near the positions (regions) at which the amplitude of the voltage is large as described above will be referred to as plasma of a capacitively coupled plasma (CCP) component. As illustrated in FIG. 2, the plasma of the CCP component is intensively generated in a donut shape in each of the regions between the lower end and the midpoint of the resonance coil 212 and between the upper end and the midpoint thereof (regions indicated by circular dotted lines) in the space along the inner wall surface in the upper vessel 210.

In this case, electrons (charges) or reactive species such as radicals or ions are generated from the plasma of the CCP component. Positive electrons (charges) generated in this operation are attracted to an inner wall side of the upper vessel 210 by the electric field which generates the plasma of the CCP component, in which the inner wall of the upper vessel 210 is charged with the positive electrons (charges). Then, negative ions (particularly, negative ions having a large mass) generated by exciting the plasma of the CCP component are accelerated toward the inner wall charged with the positive electrons (charges) and collide with the inner wall. Therefore, there is a problem that the inner wall surface of the upper vessel 210 is sputtered, and a component of a material included in the inner wall surface is released and diffused into the process chamber 201. In a case of the present embodiment, the component such as silicon (Si) or oxygen (O) constituting quartz is released into the process chamber 201 due to the sputtering of the quartz member included in the inner wall surface. The released component such as Si or O may be introduced as an impurity in a film such as a nitride film or the like formed by plasma processing, deteriorating characteristics of the film. In addition, particles may be generated in the process chamber 201 due to the sputtering of the inner wall surface, and the particles may adhere to a film surface on the substrate, which may affect, e.g., deteriorate, a performance or yield of the device.

Therefore, from a viewpoint of preventing the occurrence of sputtering on the inner wall surface of the upper vessel 210, it is desirable to suppress the generation of plasma of the CCP component.

Winding Diameter of Resonance Coil According to the Present Embodiment

Figure 3:
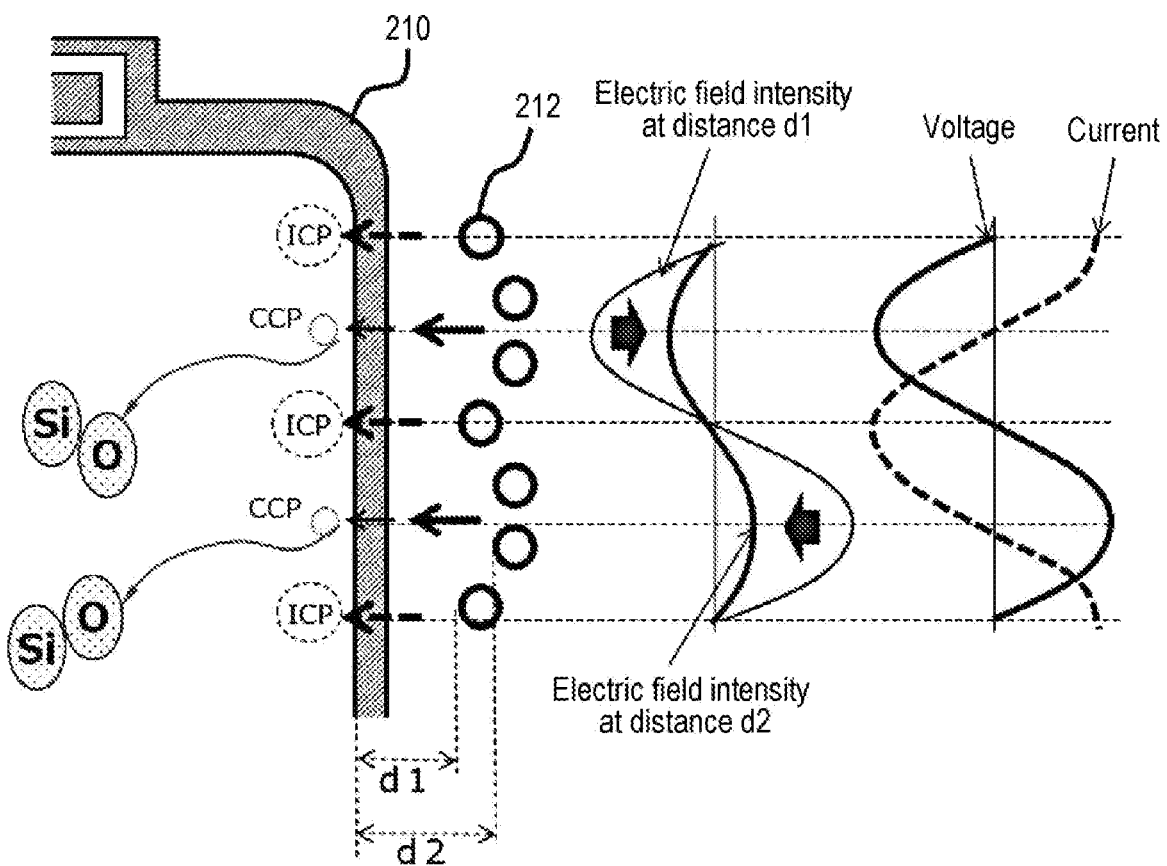
FIG. 3 is an explanatory view illustrating relationships between a winding diameter of a resonance coil and a current, a voltage, and an electric field intensity according to an embodiment of the present disclosure.

FIG. 3 illustrates some aspects of plasma generation and a winding diameter of the resonance coil 212 according to the present embodiment. A difference from the comparative example is that the winding diameter of the resonance coil 212 according to the present embodiment is different depending on a position on the resonance coil 212.

As illustrated in FIG. 3, also in the present embodiment, standing waves of a current and a voltage having a length of one wavelength of supplied high-frequency power are formed on the line of the resonance coil 212. Therefore, the amplitude of the standing wave of the current is maximized at the both ends (the lower end and the upper end) and the midpoint of the resonance coil 212. That is, the amplitude of the standing wave of the voltage is minimized (ideally zero) at the both ends (the lower end and the upper end) and the midpoint of the resonance coil 212, and is maximized at some positions between them.

In this case, in the present embodiment, the winding diameter of the coil is set so that the coil separation distance at these points (three points in the present embodiment) become a minimum distance in the entire section of the resonance coil 212. In the present embodiment, this minimum distance is set to a distance d1. More specifically, in the present embodiment, the winding diameter of the coil is set so that the coil separation distance is set to d1 at a section of the coil that is wound once around the outer periphery of the upper vessel from the lower end of the resonance coil 212, at a section of the coil that is similarly wound once around the outer periphery of the upper vessel at the midpoint of the resonance coil 212 as a center, and at a section of the coil that is similarly wound once around the outer periphery of the upper vessel from the upper end of the resonance coil 212. In the present embodiment, since the winding diameter of the coil is set so that the coil separation distance becomes a minimum distance at points at which the amplitude of the standing wave of the current is maximized in the entire section of the resonance coil 212, the plasma of the ICP component can be most intensively generated in the space along the inner wall surface in the upper vessel 210 (i.e., the plasma of the ICP component having the highest density can be generated.)

On the other hand, in the present embodiment, the coil separation distance at points at which the amplitude of the standing wave of the voltage on the resonance coil 212 is maximized (two points in the present embodiments) is set to a maximum distance d2, which is different from d1, in the entire section of the resonance coil 212. More specifically, in the present embodiment, the coil separation distance is set to a maximum distance d2, which is larger than d1, at a section that at least includes the points at which the amplitude of the standing wave of the voltage on the resonance coil 212 is maximized (two points in the present embodiment) and that is a section other than the sections where the coil separation distance is set to d1.

The intensity of the high-frequency electric field formed by the resonance coil 212 is inversely proportional to the distance from the resonance coil 212. Therefore, as indicated by a waveform on a left side of FIG. 3, the intensity of the high-frequency electric field formed according to the amplitude of the voltage of the resonance coil 212 at an inner wall surface position of the upper vessel 210 can be reduced by changing the distance d1 to the distance d2. For example, when the distance d1 is changed to d2=35 mm, the electric field intensity at the inner wall surface position of the upper vessel 210 is reduced to about 0.43 times (15 mm/35 mm).

Since the intensity of the high-frequency electric field formed near the positions (regions) at which the amplitude of the voltage is large is reduced, the formation of plasma of the CCP component of the process gas generated by the high-frequency electric field is suppressed, and the plasma density is reduced. Thus, the negative ions and positive electrons (charges) generated from the plasma of the CCP component are reduced. Further, since the intensity of the electric field formed by the resonance coil 212 is reduced, the sputtering of the inner wall surface of the upper vessel 210 by the negative ions, which are accelerated toward the positive electrons (charges) charged on the inner wall of the upper vessel 210 by the electric field, is suppressed.

That is, it is possible to suppress the component of the material included in the inner wall surface from being released and diffused into the process chamber 201. In particular, in cases of the present embodiment, it is possible to reduce an amount of a component such as Si or O of the quartz member included in the inner wall surface and released into the process chamber 201, compared with the case of the comparative example. Since the amount of released Si or O is reduced, it is possible to suppress its introduction as an impurity into a film such as a nitride film or the like formed by the plasma processing, and to improve the characteristics of the film. In addition, since the amount of particles generated in the process chamber 201 due to the sputtering of the inner wall surface is also reduced, it is possible to improve the performance or yield of the device. Furthermore, since the occurrence of sputtering on the inner wall surface is suppressed, it is also possible to suppress a damage of the upper vessel 210.

In the present embodiment, since the winding diameter of the coil is set so that the coil separation distance at the points at which the amplitude of the standing wave of the voltage is maximized becomes the maximum distance in the entire section of the resonance coil 212, it is possible to selectively suppress the generation of plasma of the CCP component in the space along the inner wall surface in the upper vessel 210.

Furthermore, specific values of the distances d1 and d2 may be appropriately adjusted according to other conditions such as a magnitude of the high-frequency power supplied to the resonance coil 212, a thickness of the resonance coil 212, an allowable amount of particles or impurity introduced into the film, a desired degree of uniformity of the plasma density (particularly in a circumferential direction of the upper vessel 210), or the like.

<Value of Distance d2>

From a viewpoint of reducing the electric field intensity at the inner wall surface position of the upper vessel 210, the distance d2 may be as large as possible. However, the distance d2 may also be set to a value larger than d1 within a predetermined range in consideration of a fact that the reactive species generated by the plasma of the CCP component are also used for the plasma processing of the substrate. For example, by setting the distance d2 to a value in a range of 30 to 50 mm, it is also possible to maintain the generation efficiency of reactive species within an allowable range while suppressing the occurrence of sputtering. In order to sufficiently achieve the effects of suppressing the occurrence of sputtering, the ratio (d1/d2) of the distance d1 and the distance d2 may be set to 0.5 or less in some embodiments. However, if d2 is set larger, the diameter of the coil is increased, which leads to an increase in a footprint of the device. Therefore, practically, the ratio may be in a range of 0.1 to 0.5 in some embodiments.

<Number of Turns of Resonance Coil at Sections where Distance d1 is Set>

In the present embodiment, the coil separation distance is set to a distance d1, particularly at three sections of the coil: the section which is wound once from the lower end of the resonance coil 212 along the outer periphery of the upper vessel, the section similarly wound once at the midpoint as the center, and the section similarly wound once from the upper end of the resonance coil 212.

On the other hand, from a viewpoint of suppressing the occurrence of sputtering, it can be considered that only the both ends (the lower end and the upper end) and the midpoint of the resonance coil 212 at which the amplitude of the standing wave of the current is maximized are set to the distance d1 to be close to the upper vessel 210, while all other sections are set to the distance d2 to be far away from the upper vessel 210. However, in this case, the density of plasma generated in the upper vessel 210 is increased only at positions near these three points, and thus a deviation of the density of plasma generated in the upper vessel 210 is increased in the circumferential direction of the resonance coil 212 (i.e., in the circumferential direction of the upper vessel). In the present embodiment, the deviation of the plasma density in the circumferential direction of the resonance coil 212 can be reduced by setting the coil separation distance to the distance d1 at the sections of the coil that is wound at least once around the outer periphery of the upper vessel 210 from these three points.

In addition, by setting the section where the coil separation distance is set to the distance d1 particularly to the sections of the coil that is wound once around the outer periphery of the upper vessel as described above, the coil separation distance is minimized for the positions on the coil at which the intensity of the generated high-frequency electric field is minimized (ideally zero) (the upper end, the midpoint, and the lower end) and their adjacent sections. That is, the section where the coil separation distance is minimized, among the sections where the high-frequency electric field is generated, is set to be the shortest within a range which satisfies a condition of preventing the occurrence of the deviation of the plasma density in the circumferential direction of the resonance coil 212 described above. Therefore, the present embodiment is suitable for suppressing the generation of the plasma of the CCP component caused by the high-frequency electric field.

Furthermore, in some embodiments, in order to further reduce the deviation of the density of the plasma generated at the sections set to the distance d1 in the circumferential direction of the resonance coil 212, the coil separation distance may be set to the distance d1 at the sections wound multiple times from these three points along the outer periphery of the upper vessel 210. However, in this case, as the distance from these three points on the resonance coil 212 is increased, the intensity of the high-frequency electric field formed at those positions is increased and the plasma density of the CCP component is increased, so that the effects of suppressing the sputtering are reduced. Therefore, in order to achieve greater effects of suppressing the sputtering, the sections set to the distance d1 may be set to be particularly wound once in some embodiments.

<Shape of Resonance Coil at Section Including Midpoint>

Figure 9:
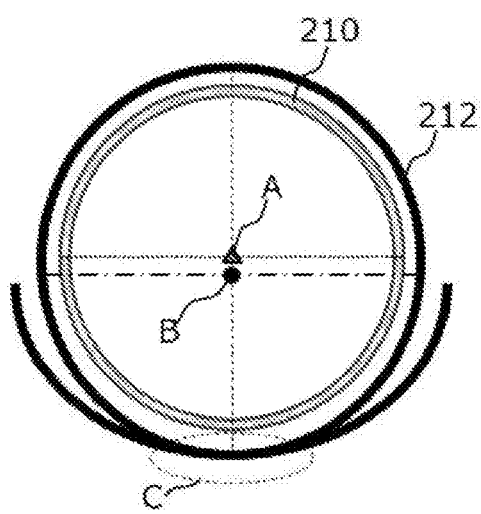
FIG. 9 is an explanatory view illustrating a relationship between a center axis position of a resonance coil and a center axis position of an upper vessel according to an embodiment of some embodiments of the present disclosure.

Furthermore, particularly at the section which is wound once and includes the midpoint of the resonance coil 212, since the high-frequency magnetic field is overlapped near a portion in which both ends of the section overlap (as viewed from an axial direction of the resonance coil 212), the intensity of the high-frequency magnetic field near the overlapped portion is likely to be larger than other sections of the section wound once, and the deviation of the plasma density in the circumferential direction of the upper vessel 210 is likely to occur near the overlapped portion. Therefore, in some embodiments, as illustrated in FIG. 9, the resonance coil 212 may be installed so that a center axis position B (a center position in the horizontal direction) of the resonance coil 212 at the section wound once with the distance d1, is deviated from a center axis position A of the upper vessel 210 (a center position in the horizontal direction) toward the direction of a portion C in which the both ends overlap.

In addition, in order to reduce the deviation of the plasma density described above, in some embodiments, the section of the resonance coil 212 wound once may be formed so that the coil separation distance at a section near the portion in which the both ends of the section wound once overlap is larger than the coil separation distance at other sections of the section wound once. Furthermore, the resonance coil 212 may also be installed such that the coil separation distance at the midpoint of the resonance coil 212, at which the intensity of the high-frequency magnetic field is the largest at the section wound once, is larger than the coil separation distance at other sections of the section wound once.

<Coil Separation Distance at Sections Other Than Section Where Distance d1 or d2 is Set>

Furthermore, in the present embodiment, the occurrence of sputtering by the plasma of the CCP component is suppressed to a minimum level by setting the coil separation distance of the entire section other than the section set to the distance d1 described above to the distance d2. On the other hand, in exemplary modifications of the present embodiment, the coil separation distance at the sections other than the section set to the distance d1 or d2 described above may be adjusted depending on the intensity of the high-frequency electric field or high-frequency magnetic field formed by the resonance coil 212 (which forms the plasma of the CCP component).

Figure 10:
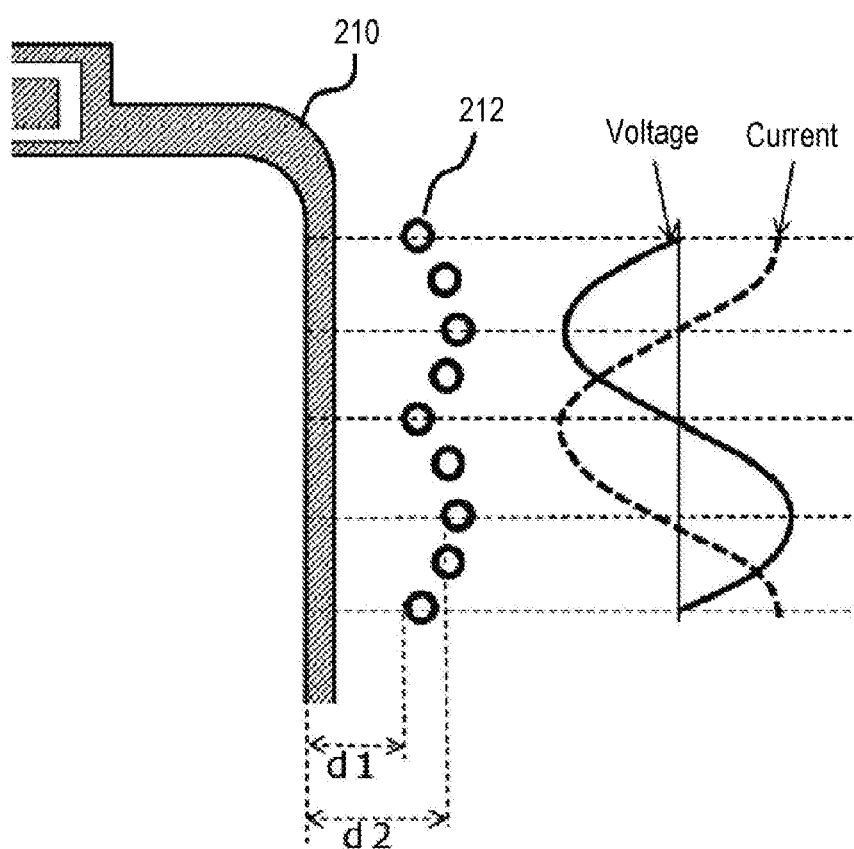
FIG. 10 is an explanatory view illustrating relationships between a winding diameter of a resonance coil and a current and a voltage according to a modification example of the present disclosure.

In this modification, the coil separation distance is set to be maximized (the distance d2 in this modification) at the points at which the amplitude of the standing wave of the voltage on the resonance coil 212 is maximized, and the coil separation distance is set to a value between d1 and d2 in consideration of balance between the plasma of the ICP component and the plasma of the CCP component at sections between the points at which the amplitude of the standing wave of the voltage is maximized and the points at which the amplitude is minimized. More specifically, for example, as in a configuration illustrated in FIG. 10, the coil separation distance is set to d2 at or near the points (at most where it is wound once) at which the amplitude of the standing wave of the voltage is maximized. Furthermore, the coil separation distance is set to be shortened (i.e., so that it approaches the distance d1) at the sections between the points at which the amplitude of the standing wave of the voltage is maximized and the points at which it is minimized, as the sections become farther from the points at which the amplitude of the standing wave of the voltage is maximized (i.e., as the amplitude of the standing wave of the voltage becomes smaller). For example, the coil separation distance may be shortened to be proportional to the amplitude of the standing wave of the voltage. By setting the coil separation distance in this way, although the effects of suppressing the sputtering by the plasma of the CCP component may be inferior to the effects of the present embodiments, it is possible to improve a generation efficiency of the plasma with respect to the electric power supplied to the resonance coil 212 compared with the present embodiments.

(Controller)

A controller 221 as a control part is configured to control the APC valve 242, the valve 243b, and the vacuum pump 246 via a signal line A, the susceptor elevator mechanism 268 via a signal line B, the heater power adjustment mechanism 276 and the impedance variable mechanism 275 via a signal line C, the gate valve 244 via a signal line D, the RF sensor 272, the high-frequency power source 273, and the matcher 274 via a signal line E, and the MFCs 252a to 252c and the valves 253a to 253c and 243a via a signal line F, respectively.

Figure 4:
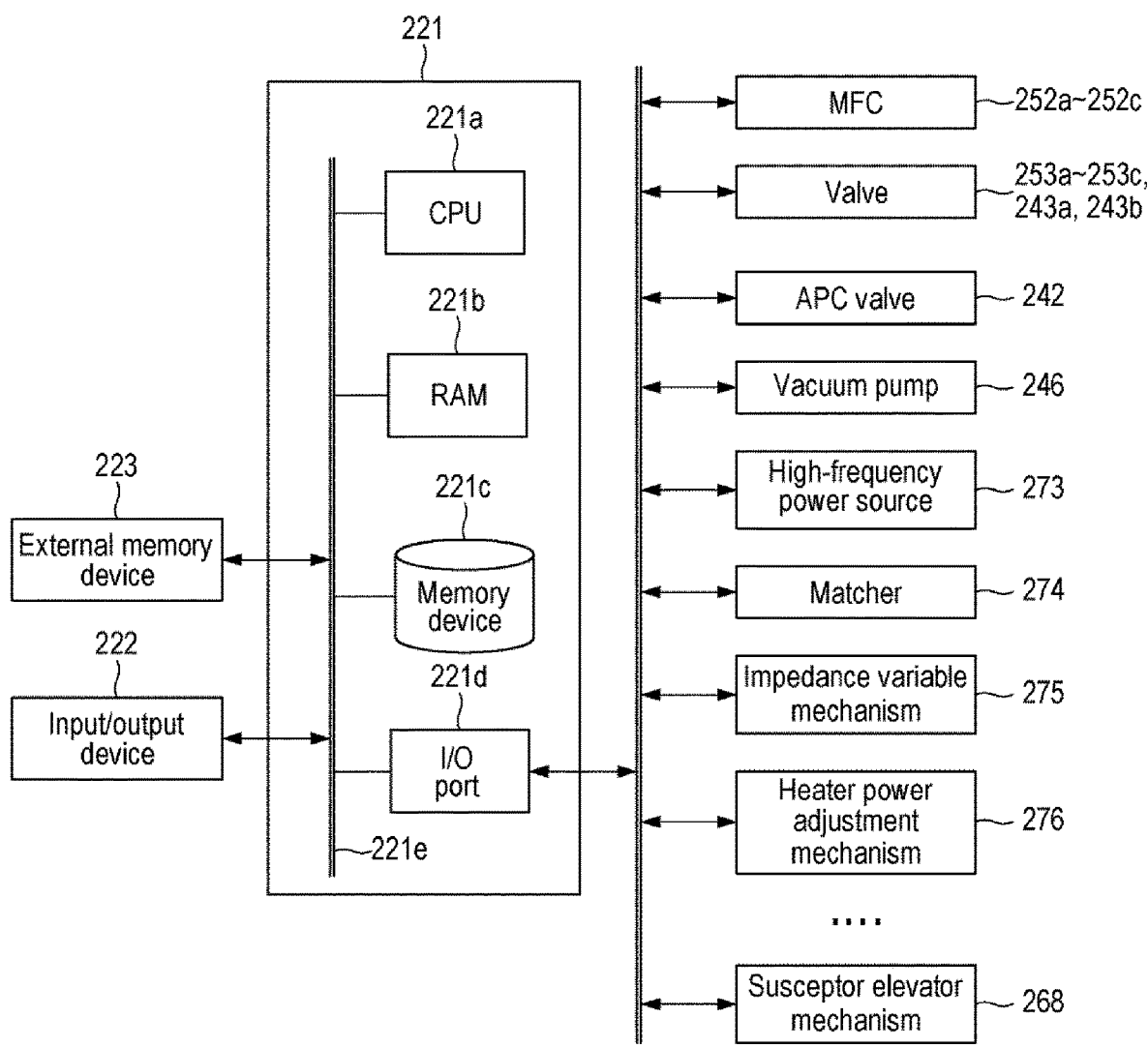
FIG. 4 is a diagram illustrating a configuration of a controller (control means) of the substrate processing apparatus according to an embodiment of the present disclosure.

As illustrated in FIG. 4, the controller 221 as the control part (control means) is configured as a computer including a central processing unit (CPU) 221a, a random access memory (RAM) 221b, a memory device 221c, and an I/O port 221d. The RAM 221b, the memory device 221c, and the I/O port 221d are configured to exchange data with the CPU 221a via an internal bus 221e. An input/output device 222 which includes, e.g., a touch panel or a display, is connected to the controller 221.

The memory device 221c includes, for example, a flash memory, a hard disk drive (HDD), or the like. A control program for controlling operations of a substrate processing apparatus, a program recipe for specifying sequences or conditions of substrate processing as described hereinbelow, or the like is readably stored in the memory device 221c. The process recipe functions as a program for causing the controller 221 to execute each sequence in the substrate processing, as described hereinbelow, to obtain a predetermined result. Hereinafter, the program recipe, the control program, or the like will be generally and simply referred to as a "program." Furthermore, when the term "program" is used herein, it may indicate a case of including only the program recipe, a case of including only the control program, or a case of including both the program recipe and the control program. The RAM 221b is configured as a memory area (work area) in which a program, data, or the like read by the CPU 221a is temporarily stored.

The I/O port 221d is connected to the MFCs 252a to 252c, the valves 253a to 253c and 243a and 243b, the gate valve 244, the APC valve 242, the vacuum pump 246, the RF sensor 272, the high-frequency power source 273, the matcher 274, and the susceptor elevator mechanism 268, the impedance variable mechanism 275, the heater power adjustment mechanism 276, and the like, as described above.

The CPU 221a is configured to read the control program from the memory device 221c and execute the control program. The CPU 221a also reads the process recipe from the memory device 221c according to an input or the like of an operation command from the input/output device 222. In addition, the CPU 221a is configured to control, according to the contents of the process recipe thus read, the opening degree adjusting operation of the APC valve 242, the opening/closing operation of the valve 243b, and the driving or stopping of the vacuum pump 246 via the I/O port 221d and the signal line A, the operation of moving the susceptor elevator mechanism 268 up or down via the signal line B, the operation of adjusting the amount of electric power supplied to the heater 217b with the heater power adjustment mechanism 276 (temperature adjusting operation) and the operation of adjusting the impedance value with the impedance variable mechanism 275 via the signal line C, the opening/closing operation of the gate valve 244 via the signal line D, the operation of the RF sensor 272, the matcher 274, and the high-frequency power source 273 via the signal line E, the flow rate adjusting operation of a plurality of kinds of gases by the MFCs 252a to 252c and the opening/closing operation of the valves 253a to 253c and 243a via the signal line F, and the like.

The controller 221 may be configured by installing, on the computer, the aforementioned program stored in an external memory device 223 (for example, a magnetic tape, a magnetic disc such as a flexible disc or a hard disc, an optical disc such as a CD or DVD, a magneto-optical disc such as an MO, or a semiconductor memory such as a USB memory or a memory card). The memory device 221c or the external memory device 223 is configured as a non-transitory computer-readable recording medium. Hereinafter, the memory device 221c and the external memory device 223 will be generally and simply referred to as a "recording medium." When the term "recording medium" is used herein, it may indicate a case of including only the memory device 221c, a case of including only the external memory device 223, or a case of including both the memory device 221c and the external memory device 223. Furthermore, the program may be provided to the computer using a communication means such as Internet or a dedicated line, instead of using the external memory device 223.

(2) Substrate Processing

Figure 5:
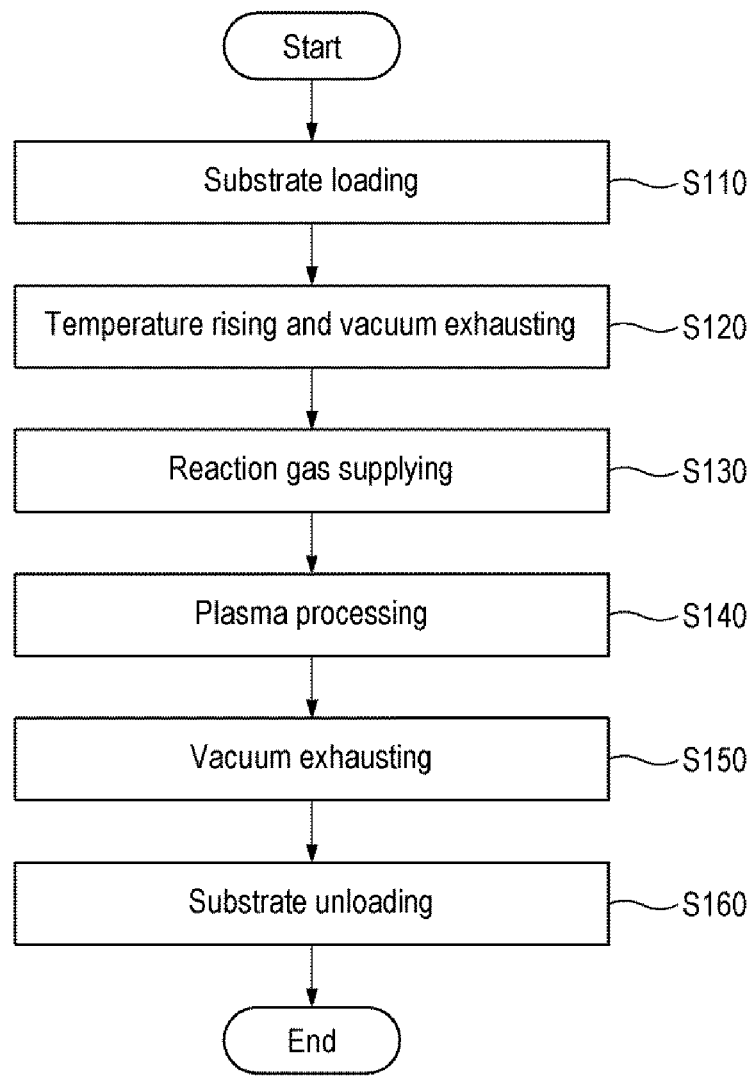
FIG. 5 is a flowchart illustrating a substrate processing according to an embodiment of the present disclosure.

Next, the substrate processing according to the present embodiment will be described mainly with reference to FIG. 5. FIG. 5 is a flowchart illustrating the substrate processing according to the present embodiment. The substrate processing according to the present embodiment, which is a process for manufacturing a semiconductor device such as, e.g., a flash memory, is performed by the aforementioned processing apparatus 100. In the following descriptions, the operations of the respective parts included in the processing apparatus 100 are controlled by the controller 221.

Figure 6:
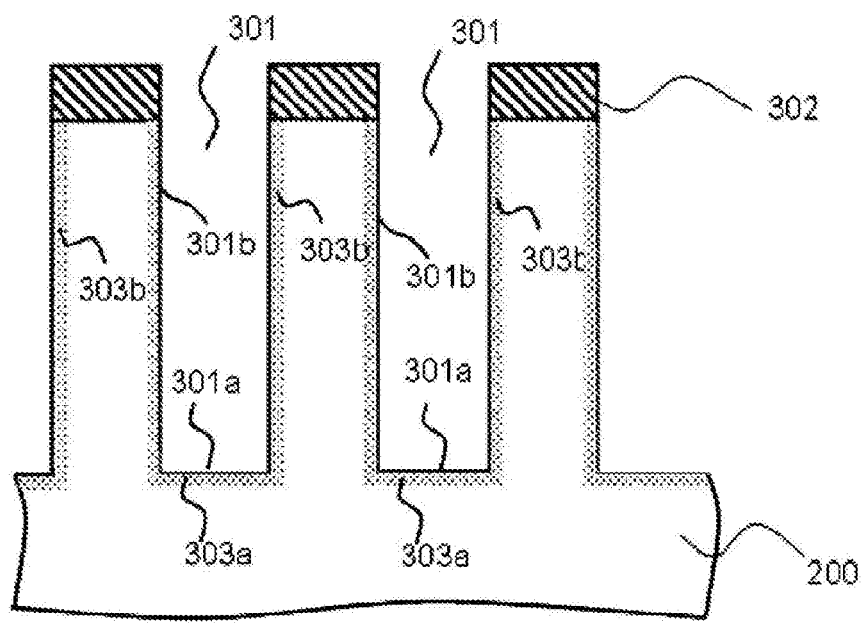
FIG. 6 is an explanatory view of a substrate, on which a groove (trench) to be processed is formed in the substrate processing, according to an embodiment of the present disclosure.

Furthermore, for example, as illustrated in FIG. 6, a trench 301 including at least a surface formed of a silicon layer and including an uneven portion with a high aspect ratio is formed in advance on a surface of a wafer 200 processed in the substrate processing according to the present embodiment. In the present embodiment, nitriding as processing using plasma is performed on the silicon layer exposed on an inner wall of the trench 301. The trench 301 is formed by, for example, forming a mask layer 302 including a predetermined pattern on the wafer 200 and etching the surface of the wafer 200 to a predetermined depth.

(Substrate Loading S110)

First, the wafer 200 described above is loaded into the process chamber 201. Specifically, the susceptor elevator mechanism 268 lowers the susceptor 217 to a transfer position of the wafer 200 so as to pass the wafer push-up pins 266 through the through holes 217a of the susceptor 217. As a result, the wafer push-up pins 266 protrude from the surface of the susceptor 217 by a predetermined height.

Subsequently, the gate valve 244 is opened, and the wafer 200 is loaded into the process chamber 201 from the vacuum transfer chamber adjacent to the process chamber 201 using a wafer transfer mechanism (not shown). The loaded wafer 200 is supported in a horizontal posture on the wafer push-up pins 266 protruding from the surface of the susceptor 217. When the wafer 200 is loaded into the process chamber 201, the wafer transfer mechanism is retracted to an outside of the process chamber 201 and the gate valve 244 is closed to seal the process chamber 201. Then, the susceptor elevator mechanism 268 raises the susceptor 217 such that the wafer 200 is supported on the upper surface of the susceptor 217.

(Temperature Rising and Vacuum Exhausting S120)

Next, a temperature of the wafer 200 carried into the process chamber 201 is raised. The heater 217b is heated in advance, and heat the wafer 200 to a predetermined value which falls within a range of, for example, 150 to 750 degrees C. by supporting the wafer 200 on the susceptor 217 in which the heater 217b is embedded. In this case, the wafer 200 is heated so that the temperature of the wafer 200 becomes equal to 700 degrees C. In addition, the interior of the process chamber 201 is vacuum-exhausted by the vacuum pump 246 via the gas exhaust pipe 231 so that an internal pressure of the process chamber 201 becomes a predetermined value while the temperature of the wafer 200 is raised. The vacuum pump 246 is operated at least until a substrate unloading S160 as described hereinbelow is completed.

(Reaction Gas Supplying S130)

Next, a supply of $N_2$ gas which is a nitrogen-containing gas, and $H_2$ gas which is a hydrogen-containing gas, as a reaction gas, starts. Specifically, the valves 253a and 253b are opened, and the supply of the $N_2$ gas and the $H_2$ gas into the process chamber 201 starts while controlling their flow rates by the MFCs 252a and 252b. In this operation, the flow rate of the $N_2$ gas may be set at a predetermined value which falls within a range of, for example, 20 to 5,000 sccm, or 20 to 1,000 sccm in some embodiments. Furthermore, the flow rate of the $H_2$ gas may be set at a predetermined value which falls within a range of, for example, 20 to 1,000 sccm, or 20 to 500 sccm in some embodiments. The flow rate ratio between the $N_2$ gas and the $H_2$ gas may be set at a predetermined ratio which falls within a range of the $N_2$ gas: $H_2$ gas=1:10 to 10:1, for example, 1:1.

In addition, the exhaust in the process chamber 201 is controlled by adjusting the degree of opening of the APC valve 242 so that the internal pressure of the process chamber 201 may be set at a predetermined pressure which falls in a range of 1 to 250 Pa, or 1 to 5 Pa in some embodiments. In this manner, the supply of the $N_2$ gas and the $H_2$ gas is continuously performed until a plasma processing S140 as described hereinbelow is completed.

Furthermore, in the present embodiment, there has been described examples in which a mixture gas of the $N_2$ gas and the $H_2$ gas is supplied as the nitrogen-containing gas. However, the present disclosure is not limited thereto but may be applied to cases where $N_2$ gas, ammonia ($NH_3$) gas, or the like is used.

(Plasma Processing S140)

When the internal pressure of the process chamber 201 is stabilized, the high-frequency power starts to be applied to the resonance coil 212 from the high-frequency power source 273 via the RF sensor 272. In the present embodiments, the high-frequency power of 27.12 MHz is supplied from the high-frequency power source 273 to the resonance coil 212. The high-frequency power supplied to the resonance coil 212 may be set at a predetermined electric power which falls within a range of, for example, 100 to 5,000 W, 100 to 3,500 W in some embodiments, or about 3,500 W in some embodiments. When the electric power is lower than 100 W, it is difficult to stably generate plasma discharge.

Thus, induction plasma is excited in the plasma generation space in the upper vessel 210 to which the $N_2$ gas and the $H_2$ gas are supplied. The plasma-state $N_2$ gas and $H_2$ gas are dissociated to generate reactive species such as nitrogen ions or nitrogen radicals containing nitrogen (nitrogen active species), hydrogen ions or hydrogen radicals containing hydrogen (hydrogen active species), or the like. The radicals generated by the induction plasma and ions in a non-accelerated state are uniformly supplied to the surface of the wafer 200 and uniformly react with the silicon layer formed on the surface of the wafer 200 to modify the Si layer into a SiN layer having good step coverage.

Thereafter, after a predetermined processing time, for example, after lapse of 10 to 300 seconds, the output of the electric power from the high-frequency power source 273 is stopped, and the plasma discharge in the process chamber 201 is stopped. Furthermore, the valves 253a and 253b are closed to stop the supply of the $N_2$ gas and the $H_2$ gas into the process chamber 201. Thus, the plasma processing S140 is completed.

(Vacuum Exhausting S150)

When the supply of the $N_2$ gas and the $H_2$ gas is stopped, the interior of the process chamber 201 is vacuum-exhausted via the gas exhaust pipe 231. Thus, the $N_2$ gas and the $H_2$ gas in the process chamber 201, an exhaust gas generated by the reaction of these gases, or the like is exhausted to the outside of the process chamber 201. Thereafter, the opening degree of the APC valve 242 is adjusted, and the internal pressure of the process chamber 201 is regulated to a pressure (e.g., 100 Pa) equal to that of the vacuum transfer chamber (a destination for unloading the wafer 200, not shown) adjacent to the process chamber 201.

(Substrate Unloading S160)

When the interior of the process chamber 201 reaches a predetermined pressure, the susceptor 217 is lowered to the transfer position of the wafer 200 to support the wafer 200 on the wafer push-up pins 266. Then, the gate valve 244 is opened and the wafer 200 is unloaded to the outside of the process chamber 201 using the wafer transfer mechanism. Thus, the substrate processing according to the present embodiments is completed.

Effects According to the Present Embodiment

Effects according to the present embodiment will be described based on results of verifications performed by the discloser.

In both first verification and second verification described below, the substrate processing apparatus according to the present embodiment described above was used. However, Comparative Examples 1 and 2 and Embodiment Examples 1 to 4 are different in that in Comparative Examples 1 and 2, the winding diameter of the resonance coil 212 was set to be constant at a distance d1=15 mm, while in Embodiment Examples 1 to 4, as the aforementioned embodiments, the winding diameter of the resonance coil 212 was differently set to distances d1 and d2 depending on a position of the resonance coil 212.

<First Verification>

In the first verification, a Si bare wafer was used as a wafer 200 as a target substrate, and the nitriding in the aforementioned embodiments was performed on the Si bare wafer to form a silicon nitride film (SiN film) on a surface of the substrate. Then, by measuring a concentration of oxygen contained in the SiN film as formed, the amount of oxygen component introduced into the film by the nitriding was evaluated. In both Comparative Example 1 and Embodiment Example 1, nitriding which forms a SiN film having a thickness of 15 Å was performed. Furthermore, in Comparative Example 1 and Embodiment Example 1, the flow rates of the $N_2$ gas and the $H_2$ gas supplied to the process chamber 201 at the reaction gas supplying S130 were set to 100 sccm and 50 sccm, respectively, the internal pressure of the process chamber 201 was set to 5 Pa, and the temperature of the wafer was set at 700 degrees C. In addition, the magnitude and supply time of the high-frequency power supplied to the resonance coil 212 were set to 500 W/120 seconds and 350 W/120 seconds, respectively.

Figure 7:
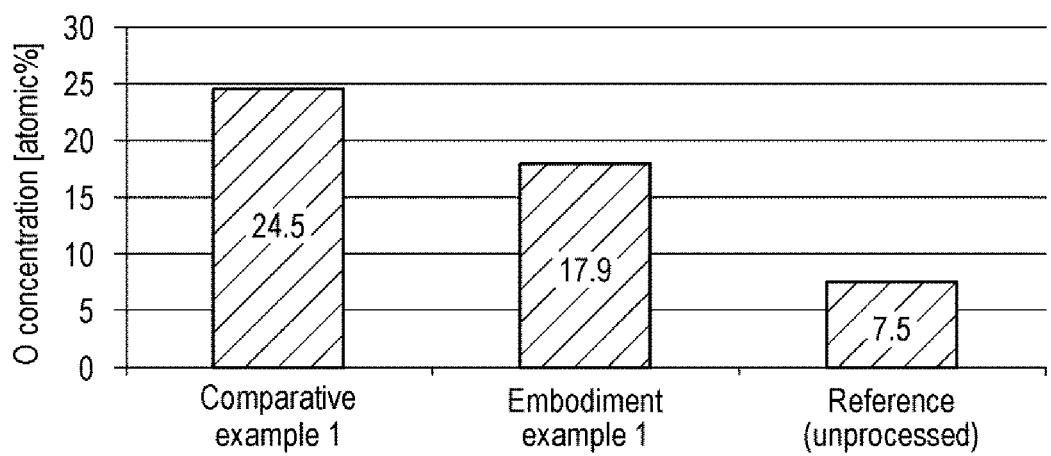
FIG. 7 is a graph for the first verification, which illustrates oxygen concentrations in SiN films formed in Comparative Example 1 and Embodiment Example 1 and an oxygen concentration in a surface layer of a Si bare wafer as a reference.

FIG. 7 illustrates results of the first verification. The vertical axis indicates a concentration of oxygen (atomic concentration) contained in the SiN film formed in each example. The term "reference (unprocessed)" at the right end refers to a result of evaluating an oxygen concentration of a surface layer of an unprocessed Si bare wafer in which nitriding was not performed. As illustrated in FIG. 7, it can be seen that the oxygen concentration in the SiN film in Comparative Example 1 was 24.5 atomic %, whereas the oxygen concentration in the SiN film in Embodiment Example 1 according to the present embodiment was 17.9 atomic %, indicating that the amount of oxygen introduced into the film in Embodiment Example 1 is clearly reduced compared with Comparative Example 1. That is, by setting the winding diameter of the resonance coil 212 as in the present embodiment, it is estimated that the release and diffusion of the oxygen component due to the sputtering of the inner wall surface of the upper vessel 210 are suppressed. Furthermore, the reason why oxygen is contained at 7.5 atomic % in the surface layer of the unprocessed Si bare wafer as the reference is that the oxygen is introduced by the natural oxidation of the Si bare wafer.

<Second Verification>

In the second verification, a wafer on which an aluminum oxide film (AlO film) is formed on its surface was used as a wafer 200 as a target substrate, and the nitriding in the aforementioned embodiments was performed on the AlO film to form an aluminum oxynitride film (AlON film) on the surface of the substrate. Then, by measuring a concentration of silicon contained in the AlON film as formed, the amount of silicon component introduced into the film by the nitriding was evaluated. In Comparative Example 2 and Embodiment Examples 2 to 4, the flow rate of the $N_2$ gas supplied to the process chamber 201 was set to 200 sccm, and the flow rate of the $H_2$ gas was set to 0 sccm (i.e., only the $N_2$ gas was supplied) at the reaction gas supplying S130. Furthermore, the internal pressure of the process chamber 201 was set to 5 Pa, and the temperature of the wafer was set at 700 degrees C. In addition, the magnitude and supply time of the high-frequency power supplied to the resonance coil 212 were set to 1 kW/300 seconds, 1.5 kW/300 seconds, 1 kW/120 seconds, and 500 W/300 seconds, respectively.

Figure 8:
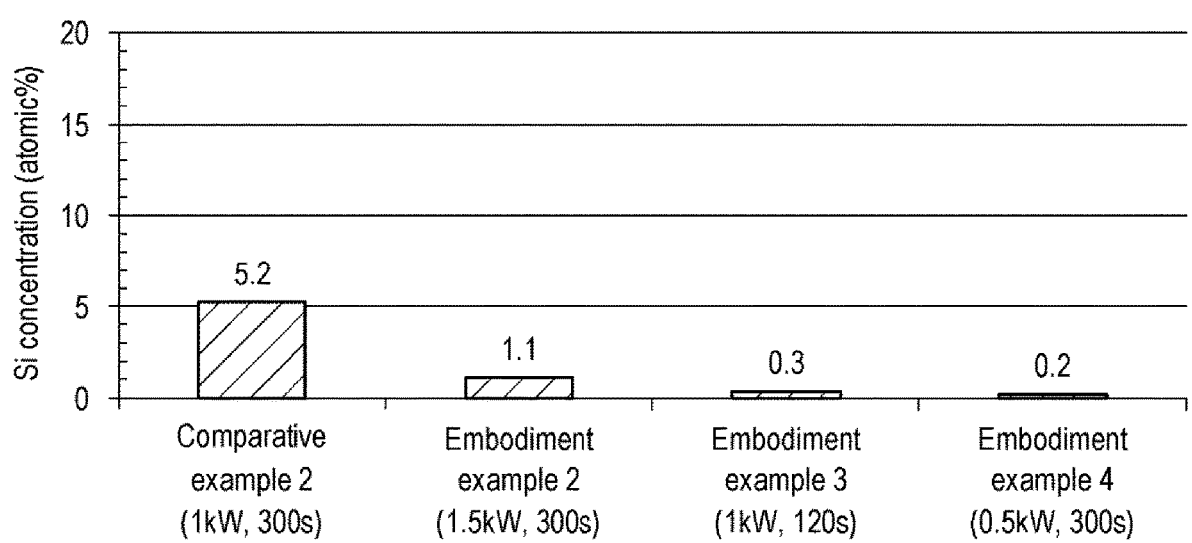
FIG. 8 is a graph for the second verification, which illustrates silicon concentrations in AlON films formed in Comparative Example 2 and Embodiment Examples 2 to 4.

FIG. 8 illustrates results of the second verification. The vertical axis indicates a silicon concentration (atomic concentration) contained in the AlON film formed in each example. As illustrated in FIG. 8, it can be seen that the silicon concentration in the AlON film in Comparative Example 2 was 5.2 atomic %, whereas the silicon concentrations in the AlON film in Embodiment Examples 2 to 4 according to the present embodiment were 1.1 atomic %, 0.3 atomic %, and 0.2 atomic %, respectively, indicating that the amount of silicon introduced into the film in Embodiment Examples 2 to 4 is clearly reduced compared with Comparative Example 2. In particular, even in Embodiment Example 2 in which the value of the high-frequency power was set larger than that in Comparative Example 2, the result of significantly reducing the amount of introduced silicon was obtained. That is, by setting the winding diameter of the resonance coil 212 as in the present embodiment, it is estimated that the release and diffusion of the silicon component due to the sputtering of the inner wall surface of the upper vessel 210 are suppressed.

Another Embodiment of the Present Disclosure

Figure 11:
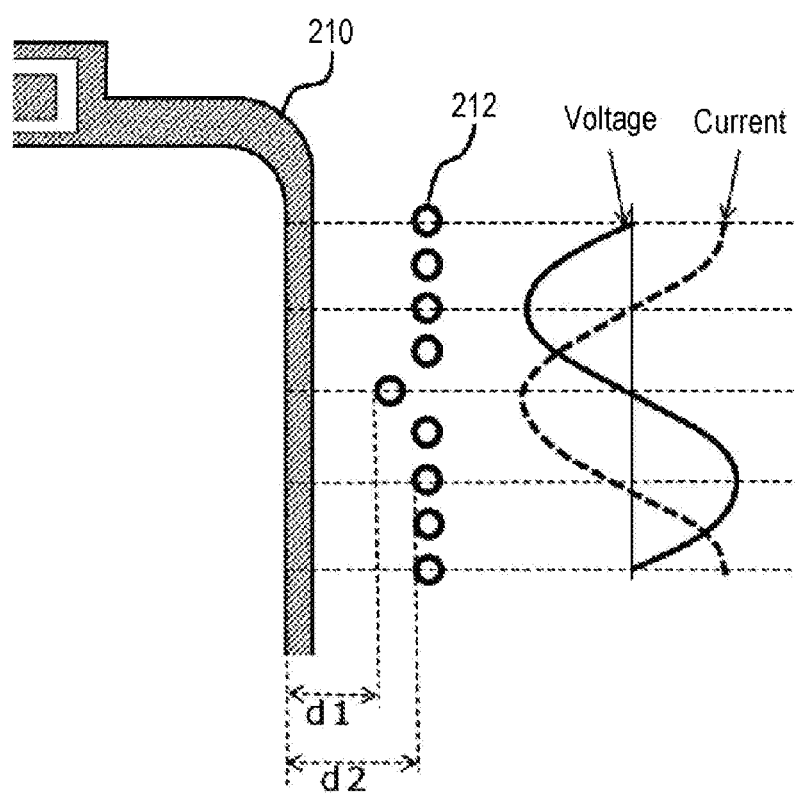
FIG. 11 is an explanatory view illustrating relationships between a winding diameter of a resonance coil and a current and a voltage according to another embodiment of the present disclosure.

In the aforementioned embodiments, the coil separation distance at the upper end, the lower end, and the midpoint of the resonance coil 212 is set to d1, but in another embodiment, as illustrated in FIG. 11, the resonance coil 212 may be configured so that the coil separation distance at the upper end and the lower end of the resonance coil 212 is also set to the distance d2 as at the sections other than the midpoint. That is, in the another embodiment, the coil separation distance is set to d1 at the section which is wound once along the outer periphery of the upper vessel 210 and includes the midpoint of the resonance coil 212.

In this case, in the aforementioned embodiments, there is a tendency that the plasma generated near the midpoint is more excellent in the uniformity of the density in the circumferential direction of the upper vessel 210 than the plasma generated near the upper end and the lower end of the resonance coil 212. Therefore, in the another embodiment, the coil separation distance at the upper end and the lower end of the resonance coil 212 is increased to reduce the intensity of the high-frequency magnetic field generated from these positions in the upper vessel 210, and to selectively generate a plasma having good uniformity generated near the midpoint thereof. Thus, from a viewpoint of improving the uniformity of the plasma density in the circumferential direction of the upper vessel 210, the another embodiment may be generally more desirable than the aforementioned embodiments. However, from a viewpoint of emphasizing the generation efficiency of reactive species, the aforementioned embodiments which also use the plasma generated near the upper end and the lower end of the resonance coil 212 may be more desirable.

Still Another Embodiment of the Present Disclosure

In the aforementioned embodiments, there has been described examples in which nitriding is performed on the surface of the substrate using plasma. However, the present disclosure may also be applied to oxidation using an oxygen-containing gas as a process gas. Furthermore, the present disclosure is not limited to nitriding and oxidation, but may be applied to any technique which performs processing a substrate using plasma. For example, in still another embodiment, the present disclosure may be applied to a doping process or a modification process on a film formed on a substrate surface using plasma, a reducing process of an oxide film, an etching process on the film, an ashing process of a resist, or the like. Furthermore, in the aforementioned embodiments, there has been described examples in which quartz is used as the material included in the upper vessel 210 on which sputtering can occur. However, in still another embodiment, the present disclosure may also be applied to cases where other materials such as $Al_2O_3$ or silicon nitride (SiC) are used. That is, it is possible to suppress the component contained in the material included in the upper vessel 210 from being introduced into an object to be processed, or to suppress the generation of particles.

According to the present disclosure, it is possible to reduce occurrence of sputtering on an inner wall of a process chamber or the like, which is generated when a process gas is plasma-excited in the process chamber.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus, comprising:
   a plasma vessel in which a process gas is plasma-excited;
   a substrate process chamber which is in fluid communication with the plasma vessel;
   a gas supply system configured to supply the process gas into the plasma vessel; and
   a coil installed to wind plural times in a spiral form around an outer periphery of the plasma vessel and configured to be supplied with high-frequency power,
   wherein the coil is installed such that:
   distances from an inner periphery of the coil to an inner periphery of the plasma vessel at plural positions of the coil between one end and the other end of the coil are different from each other;
   a distance d2 among the distances, at which an amplitude of a standing wave of a voltage applied to the coil is maximized, is maximized among a section from the one end to the other end of the coil; and
   distances d1 among the distances, at a first section that is wound once around the outer periphery of the plasma vessel from the one end of the coil, at a second section that is wound once around the outer periphery of the plasma vessel from the other end of the coil, and at a center section that is wound once around the outer periphery of the plasma vessel at a midpoint of the coil as a center of the center section are configured to be shorter than d2.

2. The substrate processing apparatus according to claim 1, wherein the coil is installed such that a distance from the inner periphery of the coil to the inner periphery of the plasma vessel at at least one of positions on the coil, at which the amplitude of the standing wave of the voltage applied to the coil is minimized, is minimized.

3. The substrate processing apparatus according to claim 1, wherein the coil is installed such that a distance from the inner periphery of the coil to the inner periphery of the plasma vessel at at least one of positions on the coil, at which an amplitude of a standing wave of a current supplied to the coil is maximized, is minimized.

4. The substrate processing apparatus according to claim 3, wherein at least one of the positions on the coil at which the amplitude of the standing wave of the current supplied to the coil is maximized is the midpoint of the coil, and
   wherein the coil is installed such that a distance from the inner periphery of the coil to the inner periphery of the plasma vessel at the midpoint of the coil is minimized.

5. The substrate processing apparatus according to claim 4, wherein the positions on the coil at which the amplitude of the standing wave of the current supplied to the coil is maximized include the one end and the other end of the coil, and
   wherein the coil is installed such that distances from the inner periphery of the coil to the inner periphery of the plasma vessel at the first section of the coil that is wound once around the outer periphery of the plasma vessel from the one end of the coil, the second section of the coil that is wound once around the outer periphery of the plasma vessel from the other end of the coil, and the center section of the coil that is wound once around the outer periphery of the plasma vessel at the midpoint of the coil as a center of the center section are minimized.

6. The substrate processing apparatus according to claim 4, wherein the coil is installed such that a distance from the inner periphery of the coil to the inner periphery of the plasma vessel at the center section of the coil that is wound multiple times around the outer periphery of the plasma vessel at the midpoint of the coil as a center of the section is minimized.

7. The substrate processing apparatus according to claim 4, wherein the coil is installed such that a distance from the inner periphery of the coil to the inner periphery of the plasma vessel at the center section of the coil that is wound once around the outer periphery of the plasma vessel at the midpoint of the coil as a center of the section is minimized.

8. The substrate processing apparatus according to claim 1, wherein the coil is installed such that a distance at a position on the coil from the inner periphery of the coil to the inner periphery of the plasma vessel becomes smaller as the position on the coil becomes farther from the position on the coil at which the amplitude of the standing wave of the voltage applied to the coil is maximized.

9. The substrate processing apparatus according to claim 1, further comprising:
   a high-frequency power source configured to supply the high-frequency power to the coil;
   a sensor configured to detect a value of reflected power from the coil; and
   a controller configured to control the high-frequency power source such that the reflected power is minimized, based on the value of the reflected power detected by the sensor.

10. The substrate processing apparatus according to claim 1, wherein the coil has an electrical length which is one time a wavelength of the high-frequency power.

11. A method of manufacturing a semiconductor device, comprising:
   loading a substrate into a substrate process chamber which is in fluid communication with a plasma vessel;
   supplying a process gas into the plasma vessel;
   plasma-exciting the process gas supplied into the plasma vessel by supplying high-frequency power to a coil installed to wind plural times in a spiral form around an outer periphery of the plasma vessel; and
   processing the substrate with excited plasma,
   wherein the coil is installed such that:
   distances from an inner periphery of the coil to an inner periphery of the plasma vessel at plural positions of the coil between one end and the other end of the coil are different from each other;
   a distance d2 among the distances at which an amplitude of a standing wave of a voltage applied to the coil is maximized, is maximized among a section from the one end to the other end of the coil; and
   distances d1 among the distances at a first section that is wound once around the outer periphery of the plasma vessel from the one end of the coil, at a second section that is wound once around the outer periphery of the plasma vessel from the other end of the coil, and at a center section that is wound once around the outer periphery of the plasma vessel at a midpoint of the coil as a center of the center section are configured to be shorter than the distance d2.

12. A non-transitory computer-readable recording medium storing a program that causes, by a computer, a substrate processing apparatus to perform a process, the process comprising:
   loading a substrate into a substrate process chamber of the substrate processing apparatus which is in fluid communication with a plasma vessel;
   supplying a process gas into the plasma vessel;
   plasma-exciting the process gas supplied into the plasma vessel by supplying high-frequency power to a coil installed to wind plural times in a spiral form around an outer periphery of the plasma vessel; and
   processing the substrate with excited plasma,
   wherein the coil is installed such that:
   distances from an inner periphery of the coil to an inner periphery of the plasma vessel at plural positions of the coil between one end and the other end of the coil are different from each other;
   a distance d2 among the distances at which an amplitude of a standing wave of a voltage applied to the coil is maximized, is maximized among a section from the one end to the other end of the coil; and
   distances d1 among the distances at a first section that is wound once around the outer periphery of the plasma vessel from the one end of the coil, at a second section that is wound once around the outer periphery of the plasma vessel from the other end of the coil, and at a center section that is wound once around the outer periphery of the plasma vessel at a midpoint of the coil as a center of the center section are configured to be shorter than d2.

\* \* \* \* \*